(12) United States Patent
Kang

(10) Patent No.: US 10,236,823 B2
(45) Date of Patent: Mar. 19, 2019

(54) SOLAR BATTERY MODULE

(71) Applicant: LG INNOTEK CO., LTD., Seoul (KR)

(72) Inventor: Kyung Ho Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 14 days.

(21) Appl. No.: 15/022,696

(22) PCT Filed: Sep. 16, 2014

(86) PCT No.: PCT/KR2014/008599
§ 371 (c)(1),
(2) Date: Mar. 17, 2016

(87) PCT Pub. No.: WO2015/041437
PCT Pub. Date: Mar. 26, 2015

(65) Prior Publication Data
US 2016/0233364 A1    Aug. 11, 2016

(30) Foreign Application Priority Data

Sep. 17, 2013 (KR) .......................... 10-2013-0111655

(51) Int. Cl.
*H01L 31/048* (2014.01)
*H02S 30/10* (2014.01)
(Continued)

(52) U.S. Cl.
CPC .......... *H02S 30/10* (2014.12); *H01L 31/0201* (2013.01); *H01L 31/02008* (2013.01);
(Continued)

(58) Field of Classification Search
CPC ............. H01L 31/0481; H01L 31/0201; H01L 31/02013; H01L 31/0508; H02S 30/10
See application file for complete search history.

(56) References Cited

U.S. PATENT DOCUMENTS

| 2005/0011551 A1 | 1/2005 | Simburger et al. |
| 2009/0173384 A1* | 7/2009 | Ooi ........................ C08F 255/02 136/259 |

(Continued)

FOREIGN PATENT DOCUMENTS

| CN | 101317275 A | 12/2008 |
| CN | 102668119 A | 9/2012 |

(Continued)

OTHER PUBLICATIONS

Dictionary.com; Define Through; accessed and printed Jul. 6, 2017; http://www.dictionary.com/browse/through.*

(Continued)

*Primary Examiner* — Edward J. Schmiedel
(74) *Attorney, Agent, or Firm* — Saliwanchik, Lloyd & Eisenschenk

(57) ABSTRACT

Disclosed is a solar cell module. The solar cell module includes a support substrate; a plurality of solar cells on a front surface of the support substrate; a bus bar electrically connected to the solar cells; and a cover member surrounding the bus bar, wherein the bus bar extends along an edge of the front surface of the support substrate to an edge of a rear surface of the support surface.

1 Claim, 4 Drawing Sheets

(51) Int. Cl.
*H01L 31/05* (2014.01)
*H02S 40/36* (2014.01)
*H02S 40/30* (2014.01)
*H01L 31/02* (2006.01)
*H02J 7/35* (2006.01)

(52) U.S. Cl.
CPC ........ *H01L 31/048* (2013.01); *H01L 31/0508* (2013.01); *H02J 7/35* (2013.01); *H02S 40/30* (2014.12); *H02S 40/36* (2014.12); *H01L 31/0481* (2013.01); *Y02E 10/50* (2013.01)

(56) References Cited

U.S. PATENT DOCUMENTS

| | | | |
|---|---|---|---|
| 2010/0037936 A1* | 2/2010 | Becker | H01L 31/02008 136/248 |
| 2010/0229918 A1* | 9/2010 | Okamoto | B32B 15/08 136/244 |
| 2010/0243040 A1 | 9/2010 | Kim | |
| 2012/0012162 A1* | 1/2012 | Kobayashi | H01L 31/02013 136/251 |
| 2012/0034799 A1 | 2/2012 | Hunt | |
| 2012/0152349 A1* | 6/2012 | Cao | H01L 31/048 136/259 |
| 2012/0216849 A1 | 8/2012 | Cho | |
| 2013/0174905 A1 | 7/2013 | Baik | |
| 2014/0246079 A1* | 9/2014 | Moon | H01L 31/0201 136/251 |

FOREIGN PATENT DOCUMENTS

| | | | |
|---|---|---|---|
| JP | S61163671 A | | 7/1986 |
| KR | 10-2012-0045633 A | | 5/2012 |
| KR | 20130056110 A | | 5/2013 |
| WO | WO-2008154524 A2 | | 12/2008 |
| WO | WO-2012/161580 A1 | | 11/2012 |
| WO | WO-2013066031 A1 * | 5/2013 | ......... H01L 31/0201 |

OTHER PUBLICATIONS

Office Action dated Feb. 4, 2017 in Chinese Application No. 201480057448.5.
International Search Report in International Application No. PCT/KR2014/008599, filed Sep. 16, 2014.
Decision of Rejection dated Aug. 3, 2018 in Chinese Application No. 201480057448.5.

* cited by examiner

【Fig. 1】
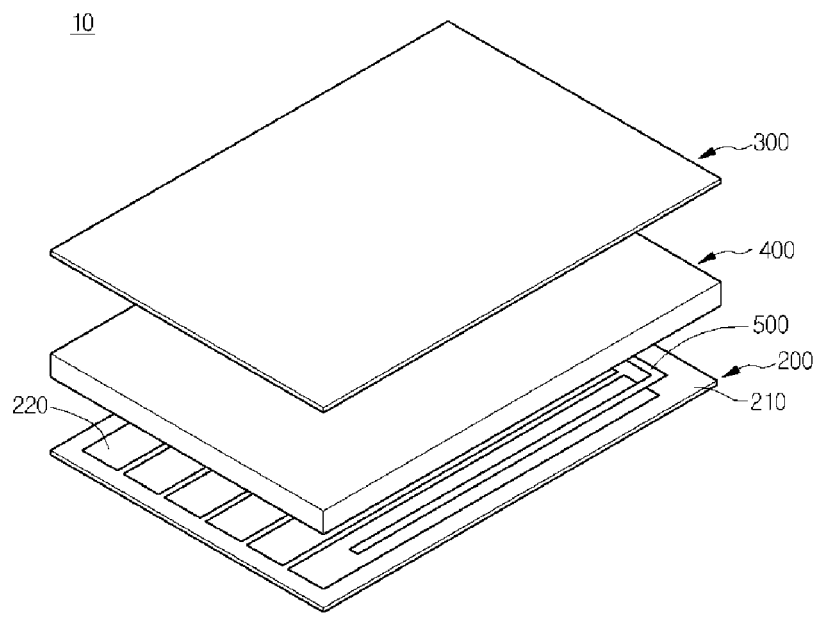
【Fig. 2】
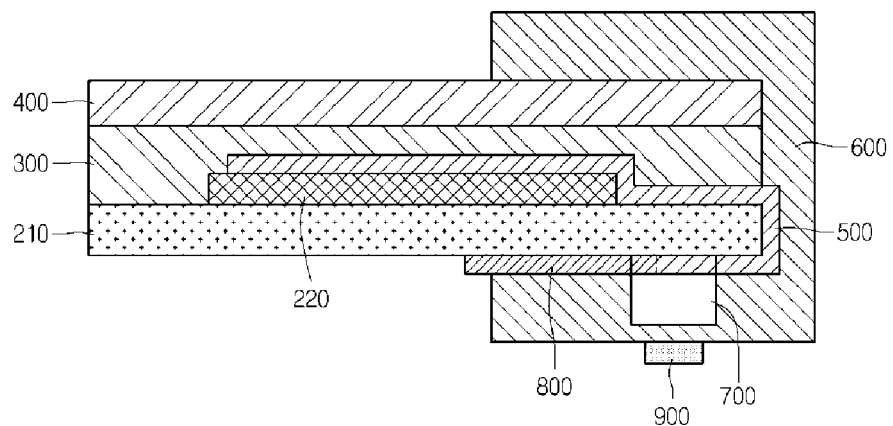

[Fig. 3]
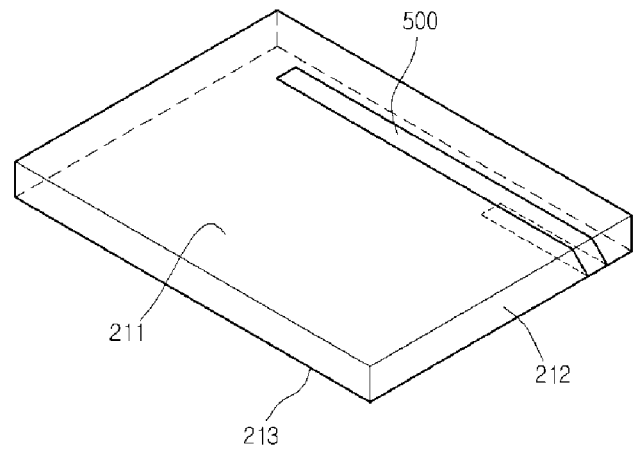
[Fig. 4]
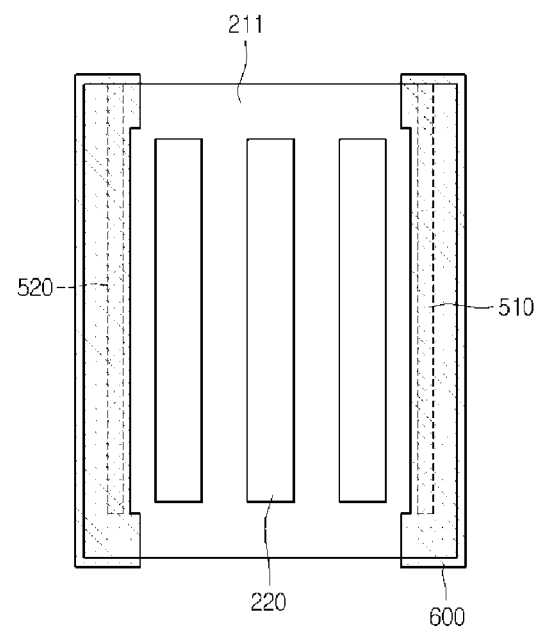

[Fig. 5]
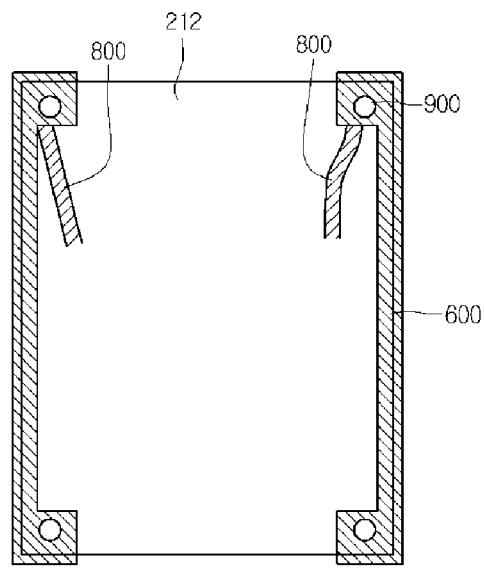
[Fig. 6]
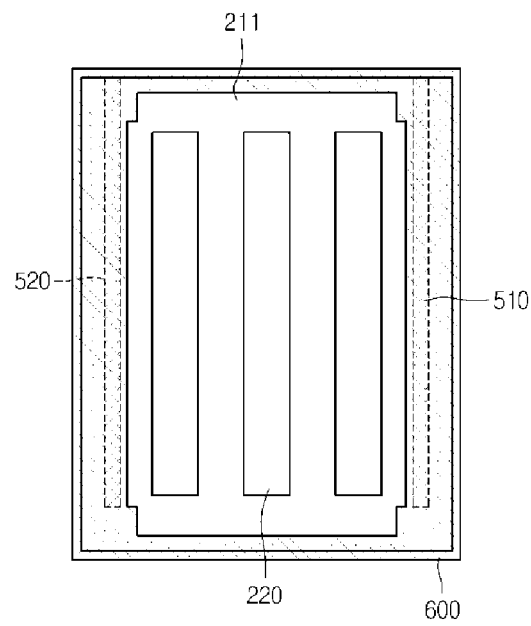

[Fig. 7]
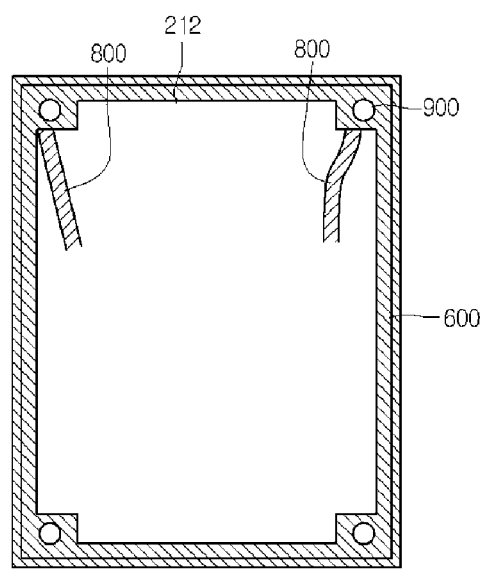

SOLAR BATTERY MODULE

CROSS-REFERENCE TO RELATED APPLICATION

This application is the U.S. national stage application of International Patent Application No. PCT/KR2014/008599, filed Sep. 16, 2014, which claims priority to Korean Application No. 10-2013-0111655, filed Sep. 17, 2013, the disclosures of each of which are incorporated herein by reference in their entirety.

TECHNICAL FIELD

The embodiments relate to a solar cell module.

BACKGROUND ART

Recently, as the lack of an energy resource such as petroleum or coal is expected, the interest in the substitute energy has been more increased. In this regard, a solar cell converting solar energy into electrical energy has been spotlighted.

A solar cell (or photovoltaic cell) is a core element in solar power generation to directly convert solar light into electricity.

For example, if the solar light having energy greater than band-gap energy of a semiconductor is incident into a solar cell having the P-N junction structure of a semiconductor, electron-hole pairs are generated. As electrons and holes are collected into an N layer and a P layer, respectively, due to the electric field formed in a PN junction part, photovoltage is generated between the N and P layers. In this case, if a load is connected to electrodes provided at both ends of the solar cell, current flows through the solar cell.

The current generated from the solar cell is transferred to a junction box through a bus bar. In general, the bus bar is formed on the front surface of a solar cell panel and extends to a rear surface of the solar cell panel through a hole formed in the solar cell panel to allow the current to flow into the junction box.

However, since the hole is formed in the panel, the durability and reliability of the panel are deteriorated. As the size of the panel is enlarged, the problems become serious.

In this regard, there has been suggested a method of increasing the thickness of a solar cell panel to prevent the panel from being bent or damaged, but this method may cause the increase in the weight of the solar cell panel and make the process complex.

Therefore, there is a need to provide a solar cell module having a new structure capable of improving the durability and reliability of a solar cell panel when a bus bar is formed on the solar cell panel.

DISCLOSURE

Technical Problem

The embodiment provides a solar cell module which may be easily manufactured and have improved reliability and durability.

Technical Solution

According to the embodiment, there is provided a solar cell module including a support substrate; a plurality of solar cells on a front surface of the support substrate; a bus bar electrically connected to the solar cells; and a cover member surrounding the bus bar, wherein the bus bar extends along an edge of the front surface of the support substrate to an edge of a rear surface of the support surface.

Advantageous Effects

According to the solar cell module of the embodiment, the bus bar extends from a front surface of a solar cell panel to a rear surface of the solar cell panel through a side surface of the solar cell panel.

That is, without forming any connecting passages such as holes in the support substrate, the bus bar extends from the front surface of the solar cell panel to the rear surface of the solar cell panel.

According to the related art, a through-hole is formed through the support substrate, and the bus bar extends through the through-hole to the rear surface of the support substrate. However, due to the through-hole, the durability of the support substrate is deteriorated. In addition, as a size of the solar cell panel is enlarged, the solar cell panel may be damaged or bent caused by deterioration of the durability.

Thus, according to the solar cell module of the embodiment, the bus bar directly extends from the front surface of the solar cell panel to the rear surface of the solar cell panel without forming any through-holes in the support substrate, so that the durability of the solar cell module may be improved.

Therefore, the solar cell module according to the embodiment may be prevented from being bent or damaged.

In addition, the solar cell module according to the embodiment may surround the bus bar by using a resin material which can be thermally molded.

That is, the cover member including a resin material may surround the bus bar while surrounding an edge of the support substrate, that is, the solar cell panel. In addition, a connecting member connected to the bus bar may be together surrounded by the cover member.

Therefore, since moisture penetration is prevented and the connecting member is miniaturized, the solar cell module according to the embodiment may have improved reliability.

DESCRIPTION OF DRAWINGS

FIG. 1 is an exploded perspective view showing a solar cell module according to an embodiment.

FIG. 2 is a sectional view taken along line A-A' of FIG. 1.

FIG. 3 is a perspective view showing a bus bar formed on a solar cell panel.

FIG. 4 is a front view showing a solar cell panel included in a solar cell module according to a first embodiment.

FIG. 5 is a rear view showing a solar cell panel included in a solar cell module according to the first embodiment.

FIG. 6 is a front view showing a solar cell panel included in a solar cell module according to a second embodiment.

FIG. 7 is a rear view showing a solar cell panel included in a solar cell module according to the second embodiment.

BEST MODE

Mode for Invention

In the following description of the embodiments, it will be understood that, when a layer (film), a region, a pattern or a structure is referred to as being "on" or "under" a substrate, another layer (film), region, pad or patterns, it can be "directly" or "indirectly" on the other layer (film), region, pattern or structure, or one or more intervening layers may also be present. Such a position of each layer described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, an embodiment will be described in detail with reference to accompanying drawings.

A solar cell module according to an embodiment will be described in detail with reference to FIGS. 1 to 7. FIG. 1 is an exploded perspective view showing a solar cell module according to an embodiment. FIG. 2 is a sectional view taken along line A-A' of FIG. 1. FIG. 3 is a perspective view showing a bus bar formed on a solar cell panel. FIG. 4 is a front view showing a solar cell panel included in a solar cell module according to a first embodiment. FIG. 5 is a rear view showing a solar cell panel included in a solar cell module according to the first embodiment. FIG. 6 is a front view showing a solar cell panel included in a solar cell module according to a second embodiment.

Referring to FIGS. 1 to 6, the solar cell module 10 according to an embodiment includes a frame 100, a solar cell panel 200, a protective substrate 300 and a buffer sheet 400.

The frame 100 is provided outside the solar cell panel 200. The frame 100 may receive the solar cell panel 200, the protective substrate 300, and the buffer sheet 400. In detail, the frame 100 surrounds a side surface of the solar cell panel 200.

For example, the frame 100 may be a metal frame 100. In detail, the frame 100 may include various metals such as aluminum, stainless steel or iron.

The frame 100 is not a necessary element. In some cases, the frame 100 may be replaced with another member.

The solar cell panel 200 may have a plate shape. The solar cell panel 200 may include a support substrate 210 and a plurality of solar cells 220 disposed on the support substrate 210.

The support substrate 210 may be an insulator. The support substrate 210 may be a glass substrate, a plastic substrate or a metal substrate. In detail, the support substrate 210 may be a soda lime glass substrate. Alternatively, the support substrate 210 may be a ceramic substrate including alumina, stainless steel, or polymer. The support substrate 210 may be transparent. The support substrate 210 may be rigid or flexible.

For example, the solar cell 220 may include a CIGS-based solar cell, a silicon-based solar cell, a dye-sensitized solar cell, a group III-IV compound semiconductor solar cell, or a group III-V compound semiconductor solar cell.

The solar cells 220 may be arranged in the shape of a stripe. In addition, the solar cells 220 may be arranged in various shapes such as a matrix shape.

The bus bar 500 may be disposed on the solar cell panel 200. The bus bar 500 may include first and second bus bars 510 and 520. The first and second bus bars 510 and 520 are connected to the solar cells 220. In detail, the first and second bus bars 510 and 520 may be directly connected to the solar cells 220. In more detail, the first and second bus bars 510 and 520 may be connected to the outmost solar cells 220, respectively.

The first and second bus bars 510 and 520 may include a conductive tape or conductive paste. The first and second bus bars 510 and 520 may include a material such as copper, silver or aluminum.

The bus bar 500 is formed on a front surface 211 of the support substrate 210. In detail, the bus bar 500 may extend along an edge of the front surface 211 of the support substrate 210 and extend to an edge of a rear surface 212 of the support substrate 210.

In detail, the first bus bar 510 may extend along an edge of one side of the front surface 211 of the support substrate 210 and extend to an edge of one side of a rear surface 212 of the support substrate 210 while passing through a side surface 213 of the support substrate 210.

In addition, the second bus bar 520 may extend along an edge of one side of the front surface 211 of the support substrate 210 and extend to an edge of one side of a rear surface 212 of the support substrate 210 while passing through a side surface 213 of the support substrate 210.

That is, the first and second bus bars 510 and 520 may extend from the front surface to the rear surface of the support substrate 210 without forming any holes in the support substrate 210.

A cover member 600 may be formed on the solar cell panel 200. In detail, the cover member 600 may be formed on the support substrate 210.

The cover member 600 may surround the bus bars 500. That is, the cover member 600 may extend along the first and second bus bars 510 and 520.

The cover member 600 may include a polymer material, that is, a resin material. In detail, the cover member 600 may include a resin-based material which can be thermally molded. For example, the cover member 600 may include one of silicon resin, epoxy resin, rubber and plastic. However, the embodiment is not limited to the above, and the cover member 600 may include various materials which can be thermally molded.

The first and second bus bars 510 and 520 may be connected to a connecting member 700 on the rear surface 212 of the support substrate 210. In detail, the first and second bus bars 510 and 520 may be connected to a junction box on the rear surface 212 of the support substrate 210.

The cover member 600 may cover the connecting member 700 and the first and second bus bars 510 and 520. That is, the cover member 600 may surround the bus bar 500 on the front surface 211 of the support substrate 210 and surround the bus bar 500 and the connecting member 700 on the rear surface 212 of the support substrate 210.

The connecting member 700 may be connected to a cable 800. That is, the first and second bus bars 510 and 520 may be connected to the cable 800 through the connecting member 700.

One end of the cable 800 may be connected to the connecting member 700 and be covered with the cover member 600. In addition, the opposite end of the cable 800 may be placed at an outside of the cover member 600. That is, the cable 800 may be partially covered with the cover member 600.

FIG. 4 is a front view showing the solar cell panel included in the solar cell module according to the first embodiment. FIG. 5 is a rear view showing the solar cell panel included in the solar cell module according to the first embodiment.

Referring to FIGS. 4 and 5, according to the solar cell panel 200 of the solar cell module of the first embodiment, the first bus bar 510 may extend along an edge of one side of the front surface 211 of the support substrate 210 and extend to an edge of one side of a rear surface 212 of the support substrate 210 through a side surface 213 of the support substrate 210.

In addition, according to the solar cell panel 200 of the solar cell module of the first embodiment, the second bus bar 520 may extend along an edge of an opposite side to the one side of the front surface 211 of the support substrate 210 and extend to an edge of the opposite side of the rear surface 212 of the support substrate 210 through the side surface 213 of the support substrate 210.

In addition, the cover member 600 may extend along the bus bar 500. That is, in the solar cell panel of the solar cell module according to the first embodiment, the cover member 600 may be formed at left and right sides or upper and right sides of the support substrate 210.

In this case, a coupling member 900 may be further formed in an edge area of the rear surface 212 of the support substrate 210. That is, the cover member 600, which extends through the front and side surfaces 211 and 213 of the support substrate 210, may surround an edge area of the support substrate 210. The coupling member 900 may be formed on the cover member 600 formed on the edge area.

Thus, when the solar cell module is coupled to an installing structure, the coupling member 900 may serve as a coupling support so that the solar cell module may be easily coupled.

Referring to FIGS. 6 and 7, according to the solar cell panel 200 of the solar cell module of the second embodiment, the first bus bar 510 may extend along an edge of one side of the front surface 211 of the support substrate 210 and extend to an edge of one side of the rear surface 212 of the support substrate 210 through the side surface 213 of the support substrate 210.

In addition, according to the solar cell panel 200 of the solar cell module of the first embodiment, the second bus bar 520 may extend along an edge of an opposite side to the one side of the rear surface 212 of the support substrate 210 and extend to an edge of the opposite side of the rear surface 212 of the support substrate 210 through the side surface 213 of the support substrate 210.

In addition, the cover member 600 may extend along an edge area of the support substrate 210. That is, the cover member 600 may extend along the edge of the support substrate 210 while surrounding the first and second bus bars 510 and 520. That is, in the solar cell panel included in the solar cell module of the second embodiment, the cover member 600 may be formed on all edges of the support substrate 210 in the upward, downward, leftward and rightward directions.

In this case, a coupling member 900 may be further formed in an edge area of the rear surface 212 of the support substrate 210. That is, the cover member 600, which extends through the front and side surfaces 211 and 213 of the support substrate 210, may surround an edge area of the support substrate 210. The coupling member 900 may be formed on the cover member 600 formed on the edge area.

Thus, when the solar cell module is coupled to an installing structure, the coupling member 900 may serve as a coupling support so that the solar cell module may be easily coupled.

As described above, according to the solar cell module of the embodiment, the bus bar extends to the rear surface through the front and side surfaces of the solar cell panel.

That is, while extending from the front surface to the rear surface of the solar cell panel, the bus bar is directly formed on the front and rear surfaces of the solar cell panel without forming any connecting passages such as holes in the support substrate.

According to the related art, a through-hole is formed through the support substrate, and the bus bar extends through the through-hole to the rear surface of the support substrate. However, due to the through-hole, the durability of the support substrate is deteriorated. In addition, as a size of the solar cell panel is enlarged, the solar cell panel may be damaged or bent caused by deterioration of the durability.

Thus, according to the solar cell module of the embodiment, the bus bar directly extends from the front surface of the solar cell panel to the rear surface of the solar cell panel without forming any through-holes in the support substrate, so that the durability of the solar cell module may be improved.

Therefore, the solar cell module according to the embodiment may be prevented from being bent or damaged.

In addition, the solar cell module according to the embodiment may surround the bus bar by using a resin material which can be thermally molded.

That is, the cover member including a resin material may surround the bus bar while surrounding an edge of the support substrate, that is, the solar cell panel. In addition, a connecting member connected to the bus bar may be together surrounded by the cover member.

Therefore, since moisture is prevented from being penetrated and the connecting member is miniaturized, the solar cell module according to the embodiment may have improved reliability.

The protective substrate 300 is disposed over the solar cell panel 200. In detail, the protective substrate 300 is disposed to face the solar cell panel 200. One side surface of the protective substrate 300 may be disposed on the same plane with one side surface of the solar cell panel 200. That is, any step differences are not formed between the one side surfaces of the protective substrate 300 and the solar cell panel 200.

The protective substrate 300 may be transparent and have a high strength. For example, the material constituting the protective substrate 300 may include tempered glass.

The buffer sheet 400 is interposed between the protective substrate 300 and the solar cell panel 200. The buffer sheet 400 protects the solar cell panel 200 from an external physical shock. In addition, the buffer sheet 400 prevents the protective substrate 300 from colliding with the solar cell panel 200.

In addition, the buffer sheet 400 may cover the solar cells 220. The buffer sheet 400 may seal the solar cells 220 from an outside. The buffer sheet 400 may protect the solar cells 220 from an external chemical shock.

The buffer sheet 400 may perform an anti-reflective function so that a greater quantity of light is incident upon the solar cell panel 200.

The buffer sheet 400 may include an insulator. In detail, the buffer sheet 400 may be formed of an insulator. For example, the material constituting the buffer sheet 400 may include ethylene vinyl acetate (EVA) resin. That is, the buffer sheet 400 may be an insulating layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
a support substrate including a front surface and a rear surface opposite the front surface;
a plurality of solar cells on the front surface of the support substrate;
a bus bar electrically connected to the plurality of solar cells; and
a cover member;
wherein the bus bar comprises a first bus bar and a second bus bar, wherein the first bus bar includes:
a first portion extending linearly in an extension direction adjacent and parallel to a first edge of the front surface of the support substrate, the first portion extending substantially an entire length of the support substrate,
a second portion extending parallel to a lateral side surface of the support substrate and perpendicular to the first portion of the first bus bar, and
a third portion extending on the rear surface of the support substrate parallel to the first portion of the first bus bar such that the first portion of the first bus bar on the front surface of the support substrate overlaps the third portion of the first bus bar on the rear surface of the support substrate;
wherein the second bus bar includes:
a first portion extending linearly in the extension direction adjacent to a second edge of the front surface of the support substrate that is parallel to and opposite the first edge of the front surface of the support substrate, the first portion extending substantially the entire length of the support substrate,
a second portion extending parallel to the lateral side surface of the support substrate and perpendicular to the first portion of the second bus bar, and
a third portion extending on the rear surface of the support substrate parallel to the first portion of the second bus bar such that the first portion of the second bus bar on the front surface of the support substrate overlaps the third portion of the second bus bar on the rear surface of the support substrate;
wherein the cover member comprises a first cover member portion that extends in a same direction as the extension direction, and the cover member comprises a second cover member portion that extends in the same direction as the extension direction, the first and second cover member portions surrounding the first and second bus bars, respectively,
wherein the first cover member portion covers an entire upper surface of the first portion of the first bus bar, and the second cover member portion covers an entire upper surface of the first portion of the second bus bar,
wherein the first and second cover member portions each surround the front surface of the support substrate, the lateral side surface of the support substrate, and the rear surface of the support substrate at the first and second edges of the support substrate, respectively,
wherein the cover member includes a resin-based material, the resin-based material including at least one of silicon resin, rubber, epoxy, and plastic,
wherein a coupling member is disposed on an outer surface of the cover member,
wherein a portion of the coupling member is formed in an edge area of the support substrate,
wherein the cover member is disposed between the support substrate and the coupling member, and
wherein the coupling member is not in direct physical contact with the plurality of solar cells.

* * * * *